United States Patent [19]

Raoux et al.

[11] Patent Number: 4,672,686
[45] Date of Patent: Jun. 9, 1987

[54] HIGH FREQUENCY ANTENNA TUNING DEVICE

[75] Inventors: Daniel Raoux, Bonnelles; Jean Choquer, Gif sur Yvette, both of France

[73] Assignee: Commissariat a l'Energie Atomique, Paris, France

[21] Appl. No.: 804,663

[22] Filed: Dec. 4, 1985

[30] Foreign Application Priority Data

Dec. 6, 1984 [FR] France .................. 84 18614

[51] Int. Cl.⁴ .............................................. H04B 1/04
[52] U.S. Cl. .................................. 455/123; 455/103; 455/129
[58] Field of Search ............... 455/103, 121, 123, 125, 455/126, 129; 343/858, 861, 876; 333/17 M

[56] References Cited

U.S. PATENT DOCUMENTS

| | | | |
|---|---|---|---|
| 3,129,386 | 4/1964 | Daly | 455/123 |
| 3,906,405 | 9/1975 | Kommrusch | 333/17 M |
| 3,970,940 | 7/1976 | Venn. | |
| 4,201,960 | 5/1980 | Skutta et al. | 455/123 |
| 4,311,972 | 1/1982 | Landt et al. | 333/17 M |
| 4,521,913 | 6/1985 | Huber et al. | 455/129 |

FOREIGN PATENT DOCUMENTS

| | | |
|---|---|---|
| 0069979 | 1/1983 | European Pat. Off. . |
| 1516842 | 7/1969 | Fed. Rep. of Germany . |
| 878645 | 1/1943 | France . |
| 2452827 | 10/1980 | France . |

*Primary Examiner*—Jin F. Ng
*Attorney, Agent, or Firm*—Michael N. Meller

[57] ABSTRACT

The invention relates to a high frequency antenna tuning device. The antenna is connected to a power transmitter, which periodically supplies power signals at predetermined high frequencies. For each frequency, the tuning device comprises a tuning capacitor connected to a switch. These switches are connected to control means, which are in turn connected to identification outputs of the frequencies of the signals supplied by the generator. The device also comprises means for detecting power signals transmitted by the antenna, so as to prevent any switching throughout the duration of a power transmission by the antenna on one of the predetermined frequencies.

4 Claims, 4 Drawing Figures

| TIME | LOGIC STATE AT 18 | LOGIC STATE AT 22 | J | K | $\bar{Q}$ |
|------|------|------|---|---|---|
| $t_0$ | 0 | 0 | 1 | 1 | 0 |
| $t_1$ | 1 | 0 | 0 | 1 | 1 |
| $t_2$ | 1 | 1 | 0 | 0 | 1 |
| $t_3$ | 0 | 1 | 1 | 0 | 1 |

HIGH FREQUENCY ANTENNA TUNING DEVICE

BACKGROUND OF THE INVENTION

The present invention relates to a high frequency antenna tuning device. It applies to the tuning of a high frequency antenna connected to a transmitter-receiver able to periodically supply power signals at frequencies predetermined by an interface. This antenna can be carried by a vehicle, whose movements over a territory it is wished to follow from a position fixing station, the transmitter-receiver supplying the aforementioned signals also being placed on the said vehicle. This type of position fixing is for example described in French patent application No. 84 03539, filed on Mar. 7th 1984 in the name of the present Applicant.

It is known to tune a high frequency antenna connected to a transmitter periodically supplying signals at frequencies predetermined by an interface. For this purpose use is made of a variable capacitor or capacitors having different values, connected to one end of the antenna. These capacitors are switched as a function of the frequency of the different frequency signals supplied by a transmitter-receiver. When these signals have a high power level, switching from one capacitor to the other may destroy the capacitors or even damage the transmitter-receiver, when it takes place during the transmission of said power signals.

SUMMARY OF THE INVENTION

The object of the present invention is to obviate these disadvantages and more particularly serves to provide a high frequency antenna tuning device using capacitors selected by switches operated by switching control means making it possible to avoid any switching, when the transmitter-receiver applies power signals to one end of the antenna.

The invention specifically relates to a high frequency antenna tuning device, in which the antenna has a first end which is connected to reference earth and a second end connected to the output of the device, one point of the antenna close to the first end being connected to the power output of a transmitter, which periodically supplies power signals transmitted by the antenna at high frequencies predetermined by an interface, the tuning device having for each predetermined frequency a tuning capacitor connected to the reference earth and to one terminal of a switch, whereof another terminal is connected to said output of the device, wherein it also comprises means for controlling the switches respectively connected to the control inputs of said switches and to frequency identification outputs of the transmitter, each identification output corresponding to one of the predetermined frequencies and supplying during each period corresponding to the transmission of power signals at said frequency, an identification signal indicating that the tranmitter is supplying on its power output a power signal at said frequency, as well as means for detecting the frequencies of the signals transmitted by the antenna, one output of said detection means being connected to the control means for supplying a detection signal preventing any switching of any random one of the switches throughout the duration of each period of transmitting power signals at each predetermined frequency.

According to another feature of the invention, the control means comprise, for each identification output of the transmitter, a first transistor operating in the switching mode, the base of the transistor being connected to the corresponding frequency identification output and its collector being connected to a first control input of a type D flip-flop, a second transistor operating in the switching mode, the base of said second transistor being connected to the output of the high frequency power detection means and its collector being connected to a second control input of the flip-flop, an output of the latter being connected to the control input of the corresponding switch, the output of said flip-flop supplying a switching control signal when an identification signal of the frequency corresponding to the identification output in question appears on said output and if no signal for the detection of transmission of power signals by the antenna is present on the output of the detection means.

According to another feature, the high frequency antenna is a loop antenna, so that the detection means incorporate a secondary antenna positioned in the vicinity of the loop, said secondary antenna being connected to a detection diode, which is itself connected to a filter, whose output constitutes the output of the detection means.

According to another feature, each switch comprises a transistor operating in the switching mode, the base of said transistor being connected to the output of the flip-flop, as well as an electromagnetic relay, whose switching control coil is connected to the collector of the control transistor.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
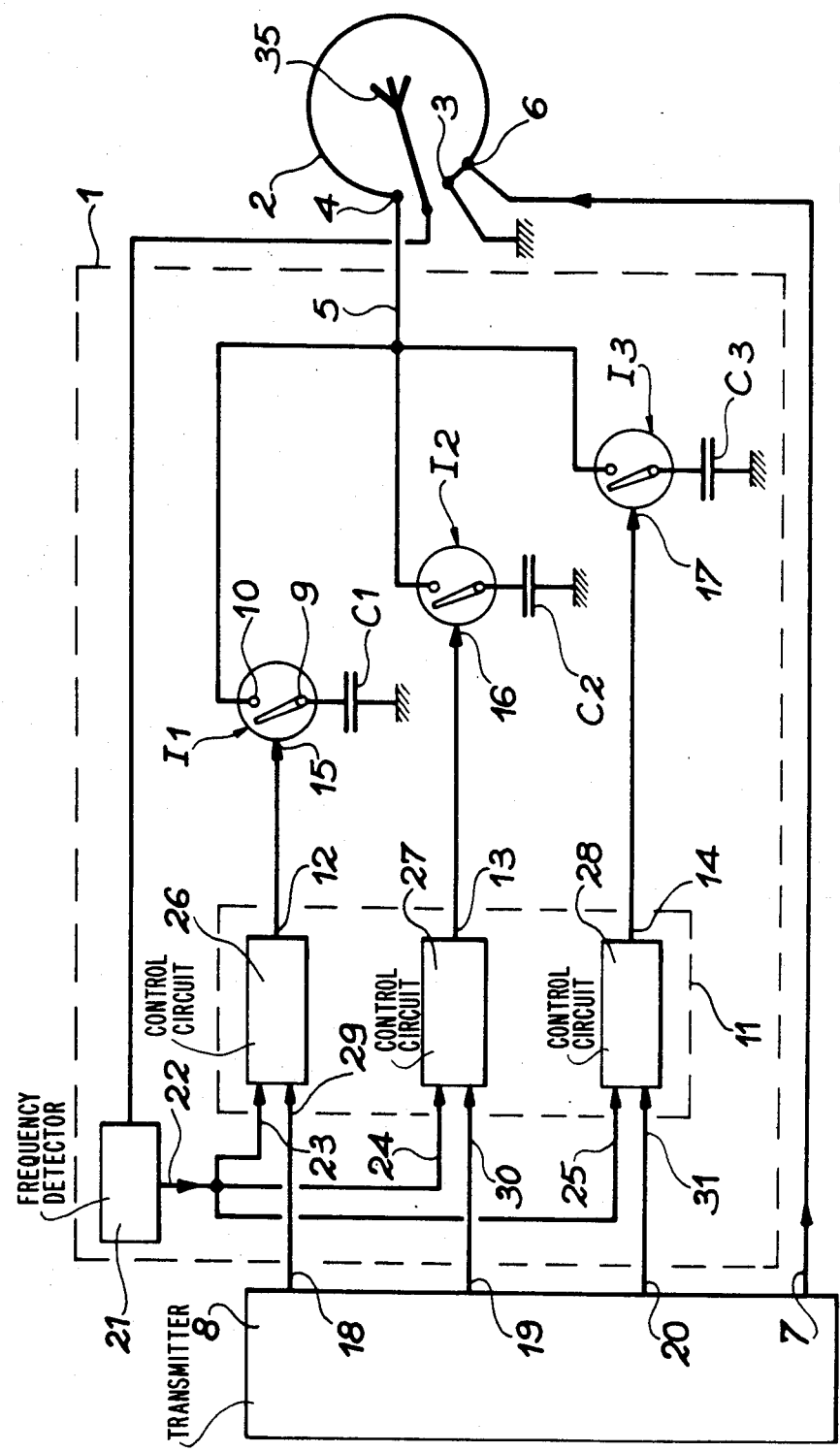
FIG. 1 diagrammatically an antenna tuning device according to the invention.

FIG. 1 diagrammatically shows a tuning device 1 for a high frequency antenna 2. This antenna which, in a preferred embodiment, is in the form of a loop, has a first end 3 connected to the reference earth and a second end 4 connected to an output 5 of the device. A point 6 of the antenna close to the first end 3 is connected to a power output 7 of a transmitter 8. The latter periodically suplies power signals to the antenna at high frequencies $F_1$, $F_2$, $F_3$, respectively for different predetermined periods, as will be shown hereinafter. The number of frequencies has been limited to three here, but it can obviously be higher. For each predetermined frequency, tuning device 1 comprises a tuning capacitor connected to reference earth and to one terminal of a switch, whose other terminal is connected to the output 5 of the device. As in the drawing the number of frequencies of the signals supplied to the output 7 of transmitter 8 has been limited to three, the number of switches and tuning capacitors is also limited to three. The capacitors corresponding to each of the frequencies $F_1$, $F_2$, $F_3$ are shown at $C_1$, $C_2$, $C_3$ and the switches at $I_1$, $I_2$, $I_3$. For example, capacitor $C_1$ is connected to reference earth, as well as to a first terminal 9 of switch $I_1$, whereof a second terminal 10 is connected to the output 5 of the device. Similar connections make it possible to respectively connect capacitor $C_2$ and $C_3$ to output 5 via switches $I_2$ and $I_3$.

The device also comprises control means 11 of switches $I_1$, $I_2$ and $I_3$. These control means are respectively connected by outputs 12, 13 and 14 of control means 11 to control inputs 15, 16 and 17 of switches $I_1$, $I_2$ and $I_3$. The control means 11 are also connected by inputs 29, 30 and 31 to frequency identification output 18, 19 and 20 of transmitter 8. These outputs respectively corresponde to the predetermined frequencies $F_1$, $F_2$ and $F_3$. Each indentification output supplies for a period corresponding to the transmission of power signals at a predetermined frequency, and identification signal indicating that the transmitter supplies on its power output 7 a power signal at said frequency. Thus, e.g. identification output 18 of transmitter 8 supplies a positive amplitude signal, when the transmitter 8 supplies on its output 7 power signals at frequency $F_1$ for a predetermined period. Outside this period, the amplitude of the signal on output 18 has e.g. a zero value. The output 19 supplies a positive amplitude signal during the period when transmitter 8 supplies a power signal at frequency $F_2$ on its power output 7. Finally, during the power signal transmission period, output 20 supplies a positive amplitude signal at frequency $F_3$ on output 7 of transmitter 8.

Finally, the device comprises means 21 for detecting the frequencies of the signals transmitted by antenna 2. One output 22 of said detection means is connected to inputs 23, 24 and 25 of the control means 11. As will be shown hereinafter, said detection means 21 supply, when antenna 2 transmits high frequency signals, a detection signal preventing any switching of any of the switches $I_1$, $I_2$ and $I_3$ throughout the duration of each power signal transmission period at each predetermined frequency. For each of the identification outputs 18, 19 and 20, the control means 11 have a control circuit. These control circuits are shown at 26, 27 and 28 in the drawing. The identification outputs 18, 19 and 20 are respectively connected to the inputs 29, 30 and 31 of control circuits 26, 27 and 28.

Figure 2:
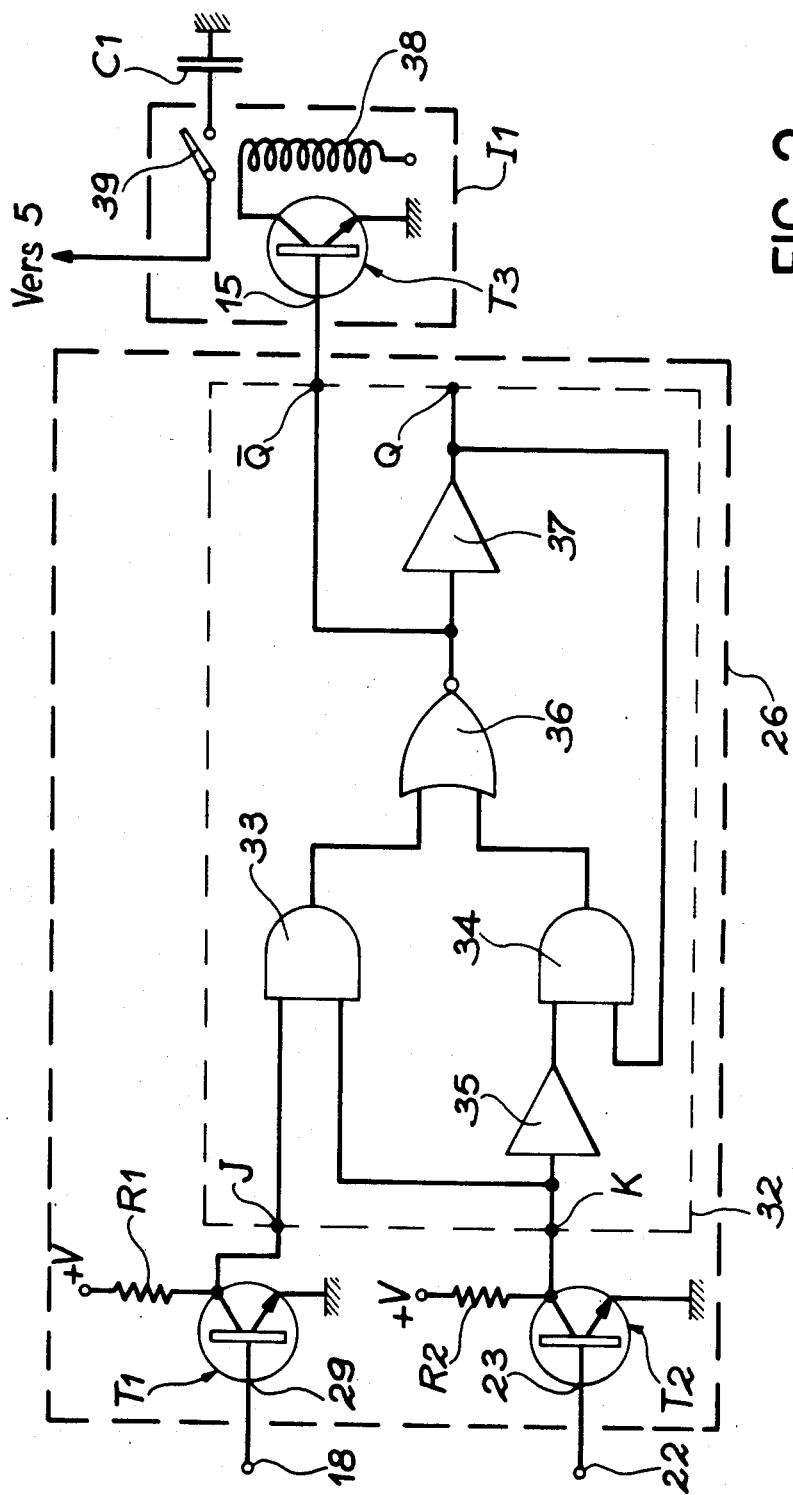
FIG. 2 diagrammatically one of the control means of the switches used in the device according to the invention.

FIG. 2 diagrammatically shows one of the control circuits (e.g. 26) belonging to the control means 11 of FIG. 1. Control circuits 26, 27 and 28 are identical.

The control circuit (e.g.26) comprises a first transistor $T_1$ operating in the switching mode. The base of said transistor is connected to the corresponding output 18 of transmitter 8 and its collector is connected to a first input J of a D flip-flop 32. The emitter is connected to reference earth, whilst the collector is also connected by a resistor $R_1$ to a positive voltage source $+V$. This transistor functions in the switching mode and its base constitutes the input 29 of control means 11. Control circuit 26 also comprises a second transistor $T_2$ operating in the switching mode. The base of this transistor is connected to the output 22 of detection means 21 and constitutes the input 23 of control means 11. The collector of this transistor is connected to another input K of flip-flop 32. This collector is also connected to the positive voltage source $+V$ by a resistor $R_2$. The emitter of transistor $T_2$ is connected to reference earth. The output $\bar{q}$ of flip-flop 32 is connected to the control input 15 of the corresponding switch $I_1$. Said output supplies a switching control signal if an identification signal of the frequency $F_1$ appears on the identification output 18 of transmitter 8 and if no detection signal of the transmission of power signals by the antenna is present on the output 22 of detection means 21. The operation of this circuit will be described hereinafter. The type D flip-flop 32 is well known in the art and e.g. comprises a first AND-gate 33, whereof one input constitutes the input J of the flip-flop and whereof another input is connected to input K of the flip-flop. The latter also comprises a second AND-gate 34, whereof one input is connected to the output of an amplifier 35, itself connected to input K of the flip-flop.

Another input of gate 34 is connected to the direct output $\bar{Q}$ of the flip-flop. The outputs of gate 33 and 34 are connected to the inputs of an OR-gate 36 with a reverse output. The output of the OR-gate 36 is connected to the input of an amplifier 37, whose output constitutes the direct output $\bar{Q}$ of the flip-flop.

The drawing also shows switch $I_1$ controlled on its input 15 by the signal appearing at output $\bar{Q}$ of flip-flop 32. Said output constitutes output 12 of the control means 11. Switch $I_1$ comprises a transistor $T_3$, whose base constitutes the control input of the switch. This transistor operates in the switching mode, its emitter being connected to the reference earth whilst its collector is connected to the control coil 38 of a relay 39. One of the terminals of this relay is connected to the tuning capacitor $C_1$, whilst the other terminal thereof is connected to output 5 of the device.

Figures 3, 4:
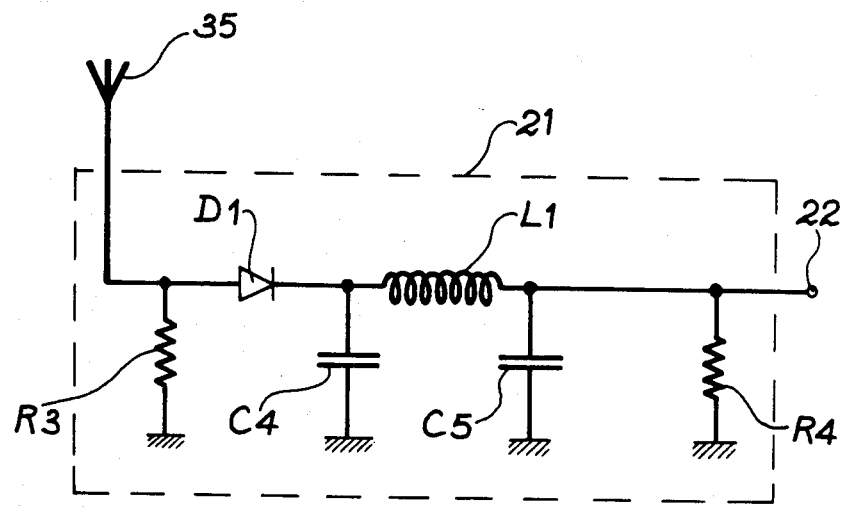
FIG. 3 a truth table providing a better understanding of the operation of the device.
FIG. 4 diagrammatically the frequency detection means used in the device according to the invention.

The truth table of FIG. 3 will now permit a better understanding of the operation of control means 11. The truth table is applied here to the operation of circuit 26 of FIG. 2. It is obvious that the operation of circuits 27 and 28 can easily be deduced from that of circuit 26. In said table, consideration will be given to different operating times $t_0$, $t_1$, $t_2$, $t_3$ of circuit 26. It is assumed that a positive amplitude of the signal supplied on the identification output 18 (indicating a transmission at frequency $F_1$) corresponds to a logic state 1, whereas a zero amplitude of said signal corresponds to a logic state zero (no transmission at frequency $F_1$). In the same way, it is assumed that a positive amplitude of the signal supplied on output 22 of detection means 21 corresponds to a logic state 1 (detection of signals transmitted by the antenna), whilst a zero amplitude corresponds to a logic state zero (no signal transmitted by the antenna). This table also indicates the logic states of the signals present on inputs J and K of flip-flop 32, as well as the logic states of the signals on output $\bar{Q}$ of flip-flop 32.

If at time $T_0$, the transmitter supplies no power signal at frequency $F_1$, the logic state of the signal on identification output 18 is zero. In the same way, if no power transmission is detected by detection means 21, the logic state of the signal on output 22 of said means is also zero. Thus, input J and K of flip-flop 32 are at logic level 1 and output $\bar{Q}$ of flip-flop 32 is at logic level zero. Relay 39 of switching means $I_1$ is consequently open.

If at time $T_1$, transmitter 8 supplies an identification signal of frequency $F_1$, the signal on indentification output 18 passes to logic state 1. If no power transmission by the antenna is detected by detection means 21, the logic state of output 22 of said means is still zero. Thus, the signals applied to inputs J and K respectively have logic states zero and 1. The output $\bar{Q}$ of flip-flop 32 then has logic state 1. Relay 39 of switch $I_1$ is consequently closed at time $T_1$.

If at time $T_2$, the transmitter starts to supply power signals at frequency $F_1$ and if consequently a power transmission is detected by means 21, output 18 and 22 of transmitter 8 and detection means 21 are at logic state 1, so that inputs J and K of flip-flop 32 are at logic state zero. The output $\overline{Q}$ of the flip-flop 32 remains at logic state 1, which maintains the closed state of relay 39.

Finally, at time $T_3$, if the identification signal at frequency $F_1$ disappears, the identification output 18 of the transmitter 8 passes to logic state zero. If a power transmission on the antenna is detected by detection means 21, output 22 of said means remains at logic state 1 and as a result inputs J and K of the flip-flop 32 are respectively in logic states 1 and zero. Thus, output $\overline{Q}$ of said flip-flop remains at logic state 1.

Thus, the closing of relay 39 can only be controlled if no power transmission is detected by means 21. This results from a well known property of a D flip-flop, namely if input K thereof is at zero, its output $\overline{Q}$ cannot change state, even if the state of its input J changes. The operation of circuits 27 and 28 can be explaned in the same way.

FIG. 4 diagrammatically shows the detection means 21, whose output 22 supplies a positive amplitude signal when the antenna transmits power signals. These detection means comprise a secondary antenna 35 connected to a detection diode $D_1$, itself connected to a filter formed in par se known manner by an inductance $L_1$, whose ends are respectively connected to capacitor $C_4$, $C_5$, themselves connected to the reference earth. Resistors $R_3$ and $R_4$ respectively connect the secondary antenna 35 and the output 22 to the reference earth. These resistors make it possible to fix the impedance of the secondary antenna.

What is claimed is:

1. A high frequency antenna tuning device, in which the antenna has a first end which is connected to reference earth and a second end connected to the output of the device, the point of the antenna close to the first end being connected to the power output of a transmitter, which periodically supplies power signals transmitted by the attenna at high frequencies predetermined by an interface, the tuning device having for each predetermined frequency a tuning capacitor connected to the reference earth and to one terminal of a switch, whereof another terminal of the switch is connected to said output of the device, wherein said tuning device further comprises means for controlling the switches respectively connected to the control inputs of said switches and to frequency identification outputs of the transmitter, each identification output corresponding to one of the predetermined frequencies and supplying during each period corresponding to the transmission of power signals at said frequency, an identification signal indicating that the tranmitter is supplying on its power output a power signal at said frequency, means for detecting the frequencies of the signals transmitted by the antenna, one output of said detection means being connected to the control means for supplying a detection signal for preventing any switching of any random one of the switches throughout the duration of each period of transmitting power signals at each predetermined frequency.

2. A device according to claim 1, wherein the control means comprise, for each identification output of the transmitter, a first transistor operating in the switching mode, the base of the transistor being connected to the corresponding frequency identification output and its collector being connected to a first control input of a type D flip-flop, a second transistor operating in the switching mode, the base of said second transistor being connected to the output of the high frequency power detection means and its collector being connected to a second control input of the flip-flop, an output of the latter being connected to the control input of the corresponding switch, the output of said flip-flop supplying a switching control signal when an identification signal of the frequency corresponding to the identification output in question appears on said output and if no signal for the detection of transmission of power signals by the antenna is present on the output of the detection means.

3. A device according to claim 2, wherein the high frequency antenna is a loop antenna, so that the detection means incorporate a secondary antenna positioned in the vicinity of the loop, said secondary antenna being connected to a detection diode, which is itself connected to a filter, whose output constitutes the output of the detection means.

4. A device according to claim 2, wherein each switch comprises a transistor operating in the switching mode, the base of said transistor being connected to the output of the flip-flop, an electromagnetic relay, comprising a switching control coil connected to the collector of the said transistor.

* * * * *